United States Patent [19]

Fay

[11] 4,434,404
[45] Feb. 28, 1984

[54] A.C. COUPLED VIDEO AMPLIFIER WITH FAST PULSE RECOVERY

[75] Inventor: Victor K. Fay, Sunnyvale, Calif.

[73] Assignee: Itek Corporation, Lexington, Mass.

[21] Appl. No.: 241,296

[22] Filed: Mar. 6, 1981

[51] Int. Cl.³ .............................................. H03F 1/34
[52] U.S. Cl. ..................................... 330/85; 330/107; 330/109; 330/110
[58] Field of Search ................. 330/85, 110, 107, 109, 330/278, 283, 294; 328/170, 171; 307/547, 549, 550, 551, 562

[56] References Cited

U.S. PATENT DOCUMENTS 3,701,028 10/1972 Markevich ...................... 328/171 X
4,227,155 10/1980 Lerma ................................ 330/85 X Primary Examiner—James B. Mullins
Attorney, Agent, or Firm—Homer O. Blair; Gerald H. Glanzman

[57] ABSTRACT

A highpass feedback loop for A.C. coupled amplifier circuits is disclosed, by means of which pulse undershoot recovery is accelerated. The feedback loop includes an operational amplifier which goes into limiting above a selected amplitude threshold so that for pulses exceeding the threshold the amplifier frequency response is unaffected.

2 Claims, 2 Drawing Figures

A.C. COUPLED VIDEO AMPLIFIER WITH FAST PULSE RECOVERY

BACKGROUND OF THE INVENTION

The present invention relates generally to high frequency amplifiers, and in particular to means for decreasing pulse recovery time inherent in an AC coupled unipolar compression video amplifier (CVA).

As is well known to those skilled in the art, if an input were DC coupled to an amplifier, there would generally be no pulse undershoot or recovery problem. However, continuous wave (CW) signals are commonly present along with pulse signals and are operated upon by DC coupled amplifiers. Accordingly, CW and pulse signals are linearly superimposed and amplified together causing difficulty in determining true pulse amplitudes, a phenomenon which is usually referred to as "jammed." Long pulses have a similar effect on amplifiers designed for narrow pulse reception.

The usual technique for eliminating CW from the incoming signal is to pass the signals through an AC coupling (a resistor-capacitor) network before applying it to the amplifier. AC coupling achieves the desired DC blocking, but necessarily introduces a "droop" into the pulse envelope starting at the leading edge, and a trailing edge undershoot equal to the droop. A pulse amplifier must recover from the trailing edge undershoot of a pulse before the next pulse arrives, or that next pulse will be offset by the undershoot. Recovery from undershoot is generally at the same rate as the droop, both being determined by the RC time constant of the AC coupling network. An increase in the RC time constant decreases the rate of droop and the amplitude of the undershoot, but decreases the rate of recovery. Output constraints often limit acceptable droop to about 8%. This means that for narrow (1 $\mu$sec) pulses there will be time for sufficient pulse recovery for pulse trains up to about 7000 pulses per second. For wider pulses, sufficient pulse recovery time requires a lower pulse per second rate. If the period of the pulses is much longer than their duration, then recoveries will be practically complete, and undershoot will not be a problem.

Pulse trains up to one million pulses per second are now being used in, for example, sophisticated radar systems. Accordingly, there is a need for amplifiers capable of recovering faster than amplifiers known heretofore to be able to handle these high pulse rates which require a recovery time for each pulse fast enough for not giving erroneous amplitudes for the next pulse. It is required that a small signal, just above the receiver's sensitivity threshold, be received unimpaired in amplitude even when a pulse with maximum amplitude and hence large undershoot and delayed recovery has immediately preceded it. Because of their relatively slow pulse recovery time, conventional AC coupled CVA's are unsatisfactory.

OBJECTS OF THE PRESENT INVENTION

It is therefore a primary object of the present invention to provide an AC coupled compression video amplifier with faster pulse recovery than was heretofore known.

It is another object of the present invention to provide an AC coupled compression video amplifier having a normal response for signals above a selected threshold amplitude and a much faster response for signals below the selected threshold which includes the trailing undershoots.

It is a further object of the present invention to provide an AC coupled compression video amplifier having a selectable amplitude threshold below which all signals, including ordinary noise, are actively suppressed.

It is still a further object of the present invention to provide an AC coupled compression video amplifier having an improved signal-to-noise ratio.

SUMMARY OF THE PRESENT INVENTION

In accordance with the present invention, an AC coupled compression video amplifier is provided with an amplitude dependent, negative feedback loop around a pair of not necessarily adjacent linear stages. The amplitude dependent portion of the feedback loop defines a threshold such that only when the amplitude of the signal applied to the feedback loop is below the threshold amplitude the feedback circuit is activated, and remains deactivated for signals with amplitudes above the threshold amplitude. The feedback loop is an active, second order, highpass filter which returns the CVA to zero an order of magnitude faster for signals below the threshold amplitude than for signals above the threshold amplitude.

DETAILED DESCRIPTION OF THE DRAWINGS

Figure 1:
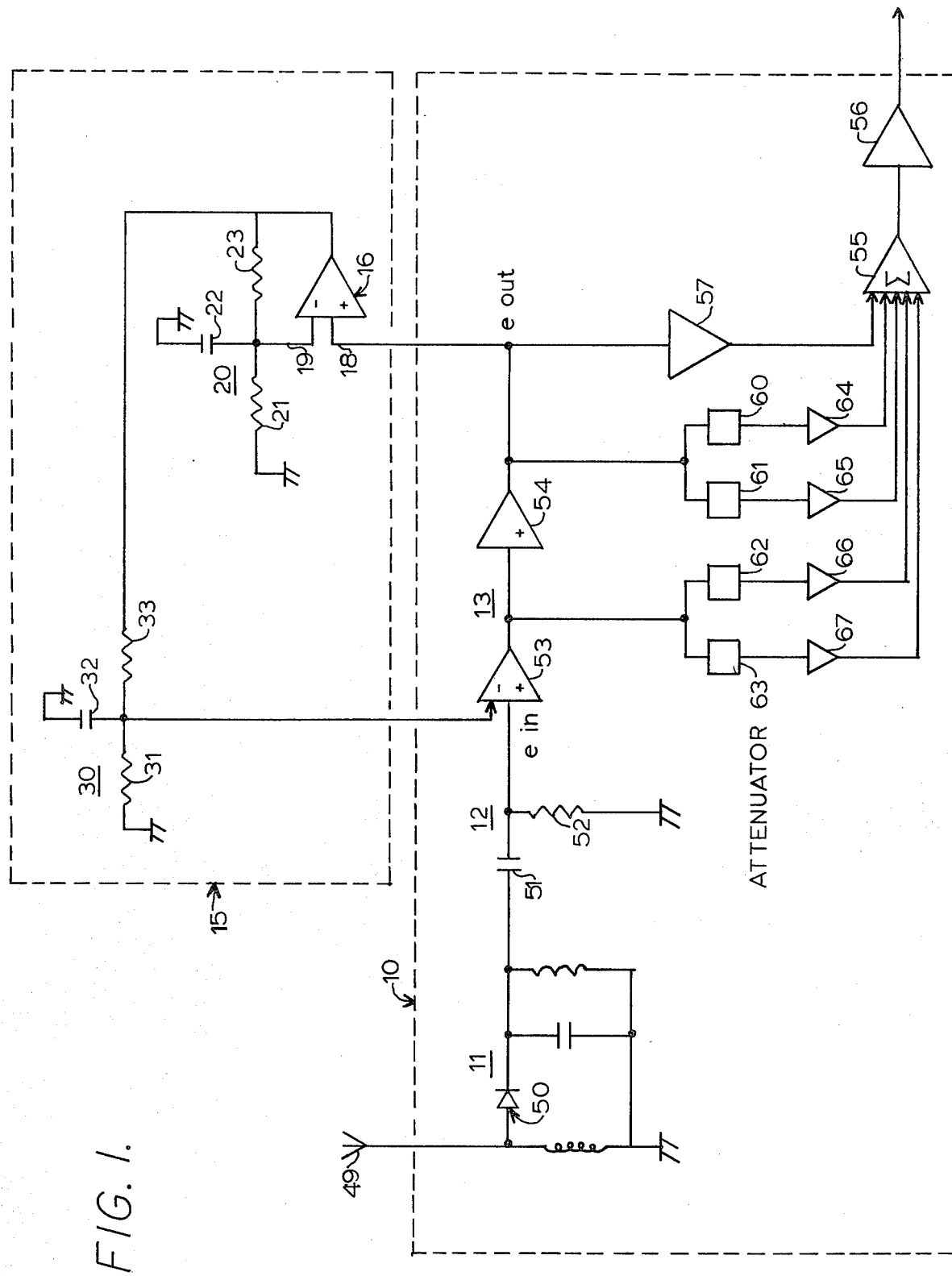
FIG. 1 is a schematic circuit diagram, partially in block form, showing the AC coupled video amplifier of the present invention.

Referring now to FIG. 1 of the drawings, there is shown a conventional unipolar compression video amplifier 10 such as is manufactured by Itek and available under the model designation ALR-46. There is further shown an amplitude dependent negative feedback loop 15 interconnected with amplifier 10 as will presently be described.

Conventional amplifier 10, as far as pertinent hereto, includes a crystal detector 11 having rectifying diode 50, the input of which is coupled to an antenna 49 and the output of which is coupled through an RC coupler 12 to the input stages 13 of the amplifier. RC coupling network 12 comprises a capacitor 51 and a resistor 52 connecting the output of the coupling capacitor to ground. The remaining stages of the amplifier include a plurality of wideband, lowpass differential linear amplifiers such as model # CA3049 manufactured by RCA. More particularly, and again as far as pertinent hereto, the coupling capacitor is connected to the input of a first linear amplifier stage 53, the output of which is coupled to another linear amplifier 54. The output of stages 53 and 54 is applied to attenuators or resistive dividers 60, 61, 62, and 63. The attenuator outputs are applied to logging stage amplifiers 64, 65, 66, and 67 respectively. Each has an operating range of about 20 db. These are programmable gain amplifiers such as model # CA3049 manufactured by RCA, which determine the compression characteristics (logarithmic or exponential) of the CVA.

Figure 2:
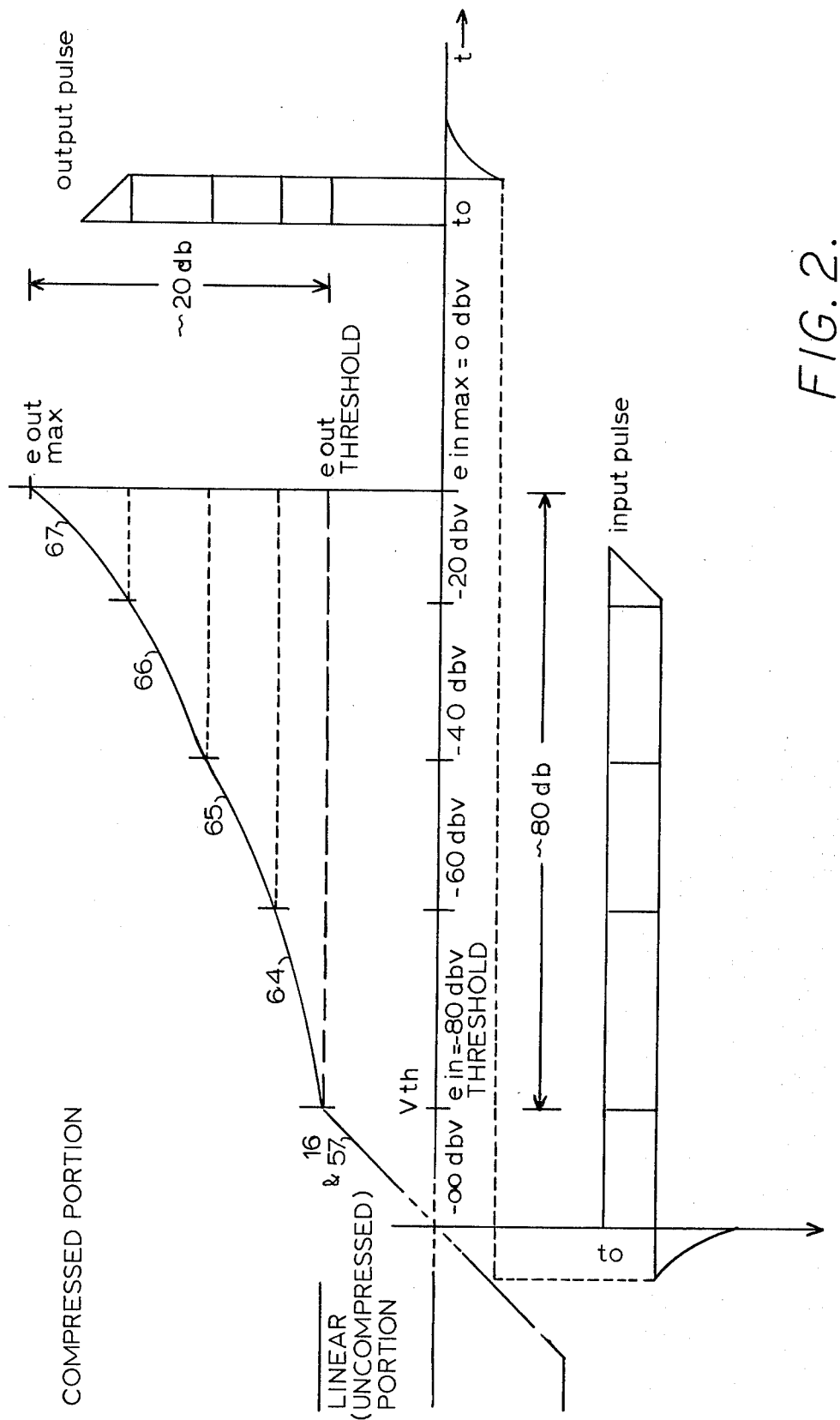
FIG. 2 is a graph of the (gain) transfer characteristic of an AC coupled video amplifier shown in FIG. 1.

Signals which are below the threshold output requirement of the CVA are also below the operating range of the lowest compression amplifier stage 64, and will not be compressed. Instead, weak signals output from amplifier 54 pass linear amplifier 57, which goes into limiting at the output threshold. The outputs of logging stages 64, 65, 66, and 67 and linear stage 57 are added together by summing amplifier 55 and applied to output amplifier 56. Amplifier 55 is a single transistor, and amplifier 56 is a wideband lowpass differential amplifier such as model # CA3049 by RCA. The output of amplifier 56 is a piece-wise approximation of the intended compression transfer characteristic with the portion below threshold uncompressed. This characteristic is shown in FIG. 2, where the curve segment numbers correspond to the particular amplifier for that band. The linear gain of the CVA in this example is about 80 db via 53-54-57-55. Stages 53 and 54 have 23 to 25 db gain and have local AC and DC feedback. Amplifier stages 57 and 55 have a gain of about 17 db each. To keep the pulse delay and zero line shift at a minimum, the linear gain stages, attenuators, logging stages and summer are DC coupled. Compression Amplifiers are discussed in *Logarithmic Video Amplifiers* by R. Hughes, published by Artech (1971).

The present invention comprises the addition of a limiting feedback loop 15 to a conventional CVA as shown in FIG. 1. AC coupling 12 between crystal detector 11 and input CVA 13 must have a high enough RC time constant to insure that the pulse droop caused by the coupling will not exceed the output amplitude threshold required of the CVA. In the preferred embodiment of this invention this time constant is about 4 msec. This allows feedback loop 15, with a threshold just below the output threshold, to admit undershoot without admitting or distorting the larger pulses being processed for output from the CVA. The feedback loop input is the positive output of amplifier 54. This input is applied to positive input terminal 18 of differential amplifier 16, such as model # AF156 manufactured by National Semiconductor, which has a threshold at and above which it goes into limiting. The output of amplifier 16 is connected in parallel to a first resistance 23 and a second resistance 33. The output of first resistance 23 is connected to ground through a third resistance 21 in parallel with a first capacitance 22. The output of first resistance 23 is also connected to a second input to limiting amplifier 16. The output of second resistance 33 is connected to ground through a fourth resistance 31 in parallel with a second capacitance 32. The output of second resistance 33 is also connected to the output of the loop, and applied as feedback to the negative input 19 of amplifier 53.

Recovery time for undershoot is reduced by a factor of 15 to 20 times because the feedback loop is designed to have a step response which returns to zero according to the time function $F(t) = G(e^{-at}(1-at))$ wherein G is a dimensionless factor representing gain, and t is time in seconds. This function has the desired property of a quick return to zero, at time $t=1/a$. A circuit with this response to a step input is implemented by using the corresponding frequency transfer function $$\frac{e_{out}}{e_{in}} = \frac{Gp^2}{p^2 + 2ap + w_o^2}$$

in which $e_{in}$ is the voltage applied to the positive input terminal of amplifier 53, $e_{out}$ is the voltage at the output of amplifier 54 as shown in FIG. 1, $a=1/t$, $w_o^2=a^2$, $p=jw$ in radians/sec. As used herein, subscripts refer to the component identified by that number in FIG. 1, R is the resistance in ohms, C is the capacitance in microfarads, and G is the gain factor, of the respective component.

$$G \simeq \frac{R_{33}}{G_{16}R_{31}}$$

is the closed loop gain below the threshold of feedback amplifier 16, and the gain of amplifier 16 is $$G_{16} = \frac{R_{23}}{R_{21}} + 1.$$

The gain of the CVA above feedback threshold is $G_{53} \cdot G_{54}$.

A feedback circuit as shown in FIG. 1 is constructed as follows: the gain $G_{53} \cdot G_{54}$ of amplifiers 53 and 54 is predetermined according to the conventional CVA 10 being used. Closed loop gain G of the feedback loop is selected with the condition that $G_{16} < G_{53} \cdot G_{54}$. The desired recovery time t is selected according to application requirements and should be approximately twice the average pulse width. Then with $a=1/t$ and $w_o^2=a^2$, the two real roots of the quadratic equation $p^2 + 2ap + w_o^2 = 0$ are found:

$$w_1, w_2 = \frac{-2a \pm \sqrt{4a^2 - 4w_o^2}}{2} = -a = -w_c$$

where $w_c$ is the cutoff frequency of the active filter being built. The component values for the two RC networks 20 and 30 of feedback loop 15 are given by the expressions:

$$w_1 = \frac{G_{16}}{R_{23}C_{22}}, \quad w_2 = \frac{G_{53}G_{54}G_{16}}{R_{33}C_{32}}.$$

A detailed analysis of the breadboarded circuit gave the following expression:

$$F(t) = \left[ e^{-at}(1-at) + te^{-at} + \frac{1}{w_o^2}(1 - e^{-at} + 1 + at) \right] G$$

for which the first term, namely $e^{-at}(1-at)$, shows the close relationship to the theoretical model. In this embodiment the effects of the second and third terms have been minimized.

The above frequency function is the general equation for a second order highpass filter. Second order highpass filters having a particular time constant product $w_o^2$ can be readily constructed in various ways by those skilled in the art.

For the purpose of illustration let us assume component values for a conventional CVA 10 and calculate the feedback loop component values necessary for a recovery in a selected time of 2 microseconds. Assuming the gain factor $G_{53}$ of amplifier 53 to be 50, and the gain factor $G_{54}$ of amplifier 54 to be 50 also, the gain factor $G_{16}$ of feedback amplifier 16 must be less than $G_{53} \cdot G_{54} = 2500$. Let $G_{16}$ equal 100, then with $t = 2$ μsec, $a = 1/t = 5 \times 10^5$ sec$^{-1}$. Let $w_o^2 = a^2 = 25 \times 10^{10}$ sec$^{-2}$. Solving the quadratic equation $p^2 + 2ap + w_o^2$ for its real roots of $w_o$, $w_1$ and $w_2$32

$$\frac{-2a \pm \sqrt{4a^2 - 4w_o^2}}{2} = 5 \times 10^5.$$

Using this value for $w_1$ and $w_2$ and the gain values selected above, the feedback component values are determined by choosing convenient capacitor values and calculating resistor values:

$$w_1 = 5 \times 10^5 = \frac{G_{16}}{R_{23}C_{22}}.$$

For $C_{22}=0.1$ $\mu$f this gives $R_{23}=2K\Omega$.

$$w_2 = 5 \times 10^5 = \frac{G_{53}G_{54}G_{16}}{R_{33}C_{32}}.$$

For $C_{32}=50$ $\mu$f this gives $R_{33}=10K\Omega$. Closed loop gain G is selected and $R_{31}$ is calculated from the loop gain equation $$G \simeq \frac{R_{33}}{G_{16}R_{31}}.$$

For $G=0.1$ this gives $R_{31}=1000\Omega$. $R_{21}$ is calculated from $$G_{16} = \frac{R_{23}}{R_{21}}$$

which gives $R_{21}=20\Omega$.

When differential amplifier 16 is referenced to zero and the overall feedback is applied, then the loop gain forces nodes 18 and 19 to be also at zero, i.e. about at the offset voltage of amplifier 16, which can be several millivolts. Hence the D.C. coupled logging stage's bias is always about zero regardless of temperature effects and parameter variation of the linear gain stages.

Although the invention has been described relative to a specific embodiment thereof, it is not so limited and, in the light of the above teaching, numerous variations and modifications thereof will be readily apparent to those skilled in the art. For example, the same principle can be applied to other receivers (AM, FM), in general. In testing several prototypes it was established that the inventive principle can achieve a significant improvement in the S/N ratio of a CVA. The frequency characteristics for the signal band and for the noise band can be chosen over a relatively wide range. Application of the inventive principle can be utilized for improving the signal-to-noise ratio for recording systems, telecommunications, and especially data transmission systems because in all of these applications a noise threshold can be assigned. The present invention is also an effective tool to suppress unwanted interferences. Because all linear stages provide what may be referred to as a linear output the feedback loop of this invention can provide Automatic Gain Control (AGC) in receivers when linearity is at a premium (cross products). Recovery time t can be selected so that $a^2$ slightly exceeds $w_o^2$ without substantially impairing the operation of the invention. It is therefore to be understood that within the scope of the appended claims the invention may be practiced otherwise than as specifically described.

What is claimed is:

1. In a multistage amplifier for alternating current signals the improvement for decreasing the pulse recovery time comprising:

a negative feedback loop disposed between the output of one and the input of any previous of the stages of said amplifier, said feedback loop comprising means for limiting the feedback signal to a selected amplitude whereby signals applied to the feedback look above said selected amplitude make the feedback loop inoperative, said feedback loop including two frequency dependent filters having together the transfer function of $$\frac{p^2}{p^2 + 2ap + w_o^2}$$

wherein $p=jw$ in radians/sec., and $w_o$ is $2\pi f$ where f is the frequency.

2. A multistage amplifier in accordance with claim 1 wherein said feedback loop includes a differential feedback amplifier including said limiting means and having first and second input terminals and an output terminal, the output signal from said multistage amplifier being coupled to said first input terminal, a first resistive impedance connected between said output terminal and said second input terminal, a second resistive impedance and a first capacitive impedance coupled in parallel between said second input terminal and ground, a third resistive impedance connected between said output terminal of said feedback amplifier and the input terminal of a previous stage of said multistage amplifier, and a fourth resistive impedance and a second capacitive impedance connected in parallel between said third resistive impedance and ground.

* * * * *